US007928324B2

(12) United States Patent
Moore

(10) Patent No.: US 7,928,324 B2
(45) Date of Patent: Apr. 19, 2011

(54) GASKETED COLLAR FOR REDUCING ELECTROMAGNETIC INTERFERENCE (EMI) EMISSION FROM OPTICAL COMMUNICATION MODULE

(75) Inventor: Joshua Moore, Sunnyvale, CA (US)

(73) Assignee: Finisar Corporation, Sunnyvale, CA (US)

( * ) Notice: Subject to any disclaimer, the term of this patent is extended or adjusted under 35 U.S.C. 154(b) by 183 days.

(21) Appl. No.: 12/139,365

(22) Filed: Jun. 13, 2008

(65) Prior Publication Data
US 2008/0315528 A1 Dec. 25, 2008

Related U.S. Application Data

(60) Provisional application No. 60/936,561, filed on Jun. 20, 2007.

(51) Int. Cl.
*H05K 9/00* (2006.01)
(52) U.S. Cl. ........ 174/354; 174/382; 174/355; 174/369; 439/607.2
(58) Field of Classification Search ................. 174/377, 174/382, 354, 355, 369; 439/607.19, 607.18, 439/607.2
See application file for complete search history.

(56) References Cited

U.S. PATENT DOCUMENTS

| | | | |
|---|---|---|---|
| 5,418,023 A | 5/1995 | Hernandez et al. | |
| 6,173,970 B1 | 1/2001 | Choudary et al. | |
| 6,206,730 B1 * | 3/2001 | Avery et al. | 439/607.18 |
| 6,443,768 B1 * | 9/2002 | Dirkers et al. | 439/607.2 |
| 6,478,622 B1 * | 11/2002 | Hwang | 439/607.2 |
| 6,540,555 B1 * | 4/2003 | Festag et al. | 439/607.2 |
| 6,612,868 B2 * | 9/2003 | Hwang | 439/607.54 |
| 7,001,217 B2 | 2/2006 | Bright et al. | |
| 7,195,404 B1 | 3/2007 | Dudley | |
| 7,229,317 B2 * | 6/2007 | Togami et al. | 439/607.2 |
| 7,438,564 B2 * | 10/2008 | Lloyd | 439/92 |
| 7,529,521 B2 * | 5/2009 | Yunker et al. | 455/90.3 |
| 7,597,590 B2 * | 10/2009 | McColloch | 439/607.18 |
| 7,729,130 B1 * | 6/2010 | Bianchini | 361/816 |
| 2006/0140552 A1 * | 6/2006 | Mizue et al. | 385/92 |
| 2006/0279937 A1 * | 12/2006 | Manson et al. | 361/724 |
| 2007/0095126 A1 | 5/2007 | Bailey et al. | |
| 2007/0117458 A1 * | 5/2007 | Winker et al. | 439/607 |
| 2008/0047746 A1 * | 2/2008 | Chen et al. | 174/369 |

OTHER PUBLICATIONS

International Search Report, PCT/US08/67126, Aug. 8, 2008, 2 Pages.
Written Opinion of the International Searching Authority, PCT/US08/67126, Aug. 8, 2008, 5 Pages.

* cited by examiner

*Primary Examiner* — Hung V Ngo
(74) *Attorney, Agent, or Firm* — Haynes and Boone, LLP

(57) ABSTRACT

A gasketed collar for reducing EMI emission from a communication module is presented. The gasketed collar includes a conductive metal collar designed to fit at least partway around the communication module, and a gasket. The gasket is electrically conductive and compressible. The gasket fits at least partway around the communication module and overlaps the conductive metal collar. A communication module including such gasketed collar and a method of making such communication module are also presented.

31 Claims, 12 Drawing Sheets

GASKETED COLLAR FOR REDUCING ELECTROMAGNETIC INTERFERENCE (EMI) EMISSION FROM OPTICAL COMMUNICATION MODULE

CROSS-REFERENCE TO RELATED APPLICATION(S)

This patent application claims the benefit of U.S. Provisional Patent Application No. 60/936,561 filed on Jun. 20, 2007, the content of which is incorporated by reference herein.

BACKGROUND

1. Field of Invention

The invention relates generally to communication modules and in particular to a gasket for reducing the amount of electromagnetic interference (EMI) emitted from a module during operation.

2. Relevant Technology

Fiber optics are increasingly used for transmitting voice and data signals. While optical communications provide a number of advantages, the use of light as a transmission medium presents a number of implementation challenges. In particular, a number of protocols define the conversion of electrical signals to optical signals and transmission of those optical signals, including the ANSI Fibre Channel (FC) protocol. The FC protocol is typically implemented using a transceiver module at both ends of a fiber optic cable. Each transceiver module typically contains a laser transmitter circuit capable of converting electrical signals to optical signals, and an optical receiver capable of converting received optical signals back into electrical signals.

Typically, a transceiver module is electrically interfaced with a host device—such as a host computer, switching hub, network router, switch box, computer I/O and the like—via a compatible connection port. Moreover, in some applications it is desirable to miniaturize the physical size of the transceiver module to increase port density, and therefore accommodate a higher number of network connections within a given amount of physical space. In addition, in many applications, it is desirable for the module to be hot-pluggable, which permits the module to be inserted and removed from the host system without removing electrical power. For example, the Small Form-factor Pluggable ("SFP") Transceiver MultiSource Agreement ("MSA") was implemented to standardize the physical size and shape of optical transceiver modules to insure compatibility between different manufacturers. In SFP modules, usually a transceiver module is selectively removable from a port which is fixedly attached to the chassis or housing of the host device.

Another design consideration is the amount of electromagnetic interference (EMI) that is radiated by a certain component, module, or system. Equipment such as high speed data systems generate and transmit many signals in the radio frequency portion of the electromagnetic spectrum. EMI radiation is of concern because interference to other components or equipment may result if sufficient power from these signals escapes the equipment enclosures. Such interference may result in malfunctioning of some or all of the electronic system. EMI radiation may also limit the density of components in the system. Various national and international regulatory agencies (e.g., FCC, CISPR, etc.) have set limits for EMI emissions.

Nevertheless, many conventional transceiver configurations lack the ability to adequately reduce EMI emissions. Furthermore, as data rate gets higher and EMI emissions increase in frequency, conventional EMI shielding mechanisms that worked for lower-frequency emissions sufficiently well are becoming inadequate. Therefore, there is a need for a method and mechanism for providing adequate EMI shielding when even a high-data rate optical transceiver module is disposed in the host port. This method and/or mechanism also has to comply with existing standards. Such a module having adequate EMI shielding would allow a host system to provide a higher packing density, and yet allow the use of a small form factor transceiver module that complies with existing sizing standards.

SUMMARY

In one aspect, the invention is a gasketed collar for reducing EMI emission from a communication module. The gasketed collar includes a conductive metal collar designed to fit at least partway around the communication module, and a gasket. The gasket is electrically conductive and compressible. The gasket fits at least partway around the communication module and overlaps the conductive metal collar.

In another aspect, the invention is a method of reducing EMI emission from a communication module. The method includes placing a gasket to overlap a conductive metal collar that fits at least partway around the communication module such that the gasket closes an opening in the conductive metal collar.

In yet another aspect, the invention is a communication module. The communication module includes a module body and the above-described gasketed collar.

DETAILED DESCRIPTION OF THE EMBODIMENT(S)

Embodiments of the invention are described herein in the context of an SFP+ optical transceiver module. However, it is to be understood that the embodiments provided herein are just exemplary embodiments, and the scope of the invention is not limited to the applications or the embodiments disclosed herein. Thus, mechanical, compositional, structural, electrical, and operational changes may be made without departing from the spirit and scope of the present disclosure. The following detailed description is not to be taken in a limiting sense, and the scope of the embodiments of the present invention is defined only by the claims of the issued patent.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

As used herein, "gasketed collar" refers to a combination of a gasket and a collar clip. A gasketed collar is not necessarily a separate, free-standing assembly part. For example, even if the gasket is first attached to a shell and then the collar clip is added on top of the gasket, the combination of the gasket and the collar would be a "gasketed collar."

Figure 1:
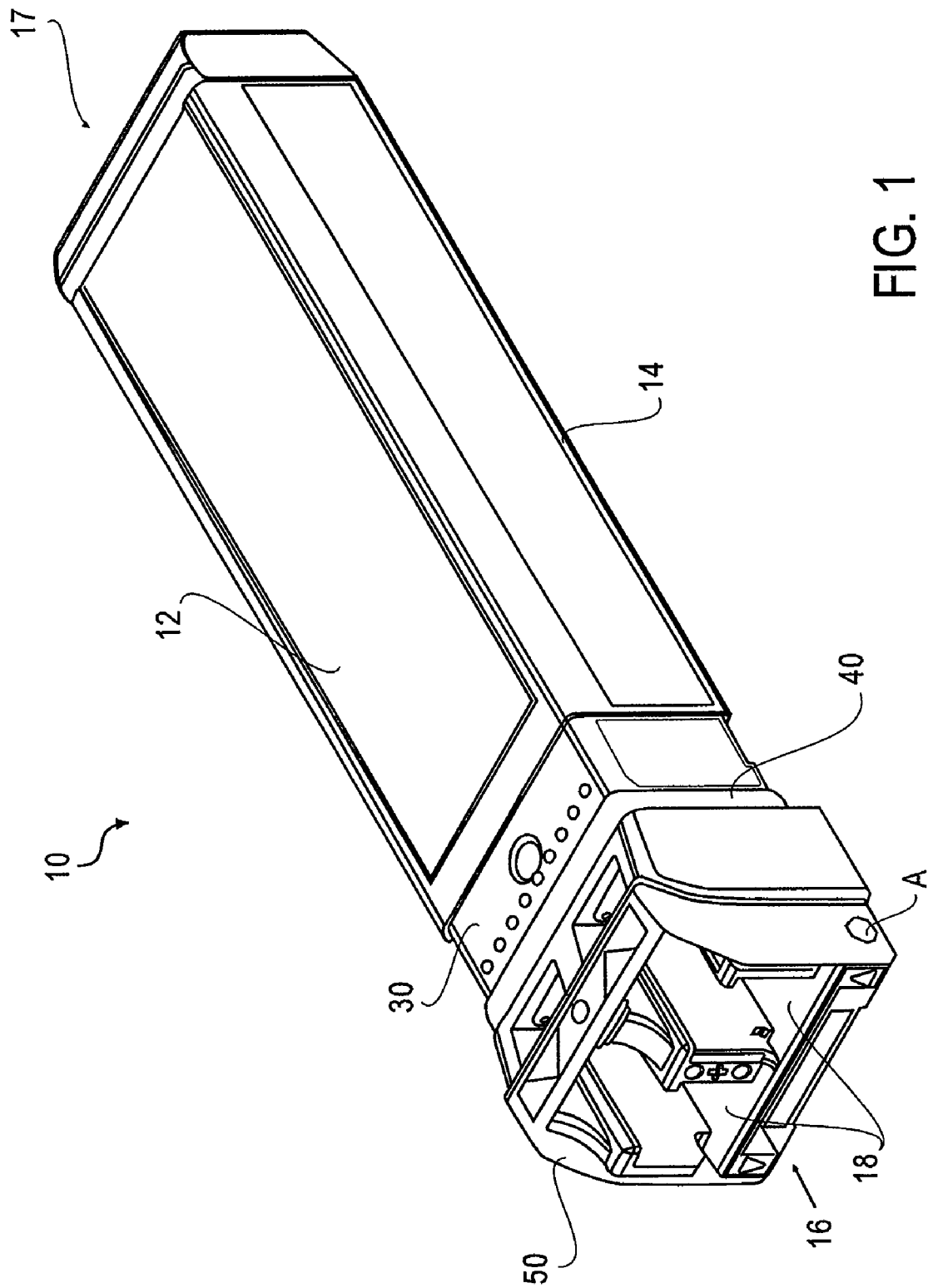
FIG. 1 is a perspective view of a communication module in accordance with a first embodiment of the invention.

FIG. 1 is a perspective view of a communication module in accordance with a first embodiment of the invention. Specifically, the module shown in FIG. 1 is an optical transceiver module 10. Although the particular transceiver module 10 that is depicted conforms to the SFP+ configuration, this is merely exemplary and other communication modules and transceivers may benefit from the invention described herein. The transceiver module 10 is not limited to any transmission/reception speed, and could operate at 1 Gbit, 2 Gbit, 4 Gbit, 8 Gbit, 10 Gbit, or higher data rates.

The transceiver module 10 includes a body composed of a top shell portion 12 and a bottom shell portion 14. The transceiver module 10 has a front end 16 and a back end 17. The front end 16 has two openings 18 for connecting to an optical fiber (not shown). Typically, the transceiver module 10 is designed to slide into a cage in a host device (not shown) back-end first so that once the transceiver module 10 is in place, only the front end 16 and the parts around it are exposed. At the front end 16, there is a bail 50 that is pivotably attached to the bottom shell portion 14. The bail 50 can be pivoted about the pivot point A to move a latch that is capable of securing the transceiver module 10 to a host device cage. The transceiver module 10 also includes a collar clip 30 and a gasket 40 that reduce leakage of EMI.

Figure 2:
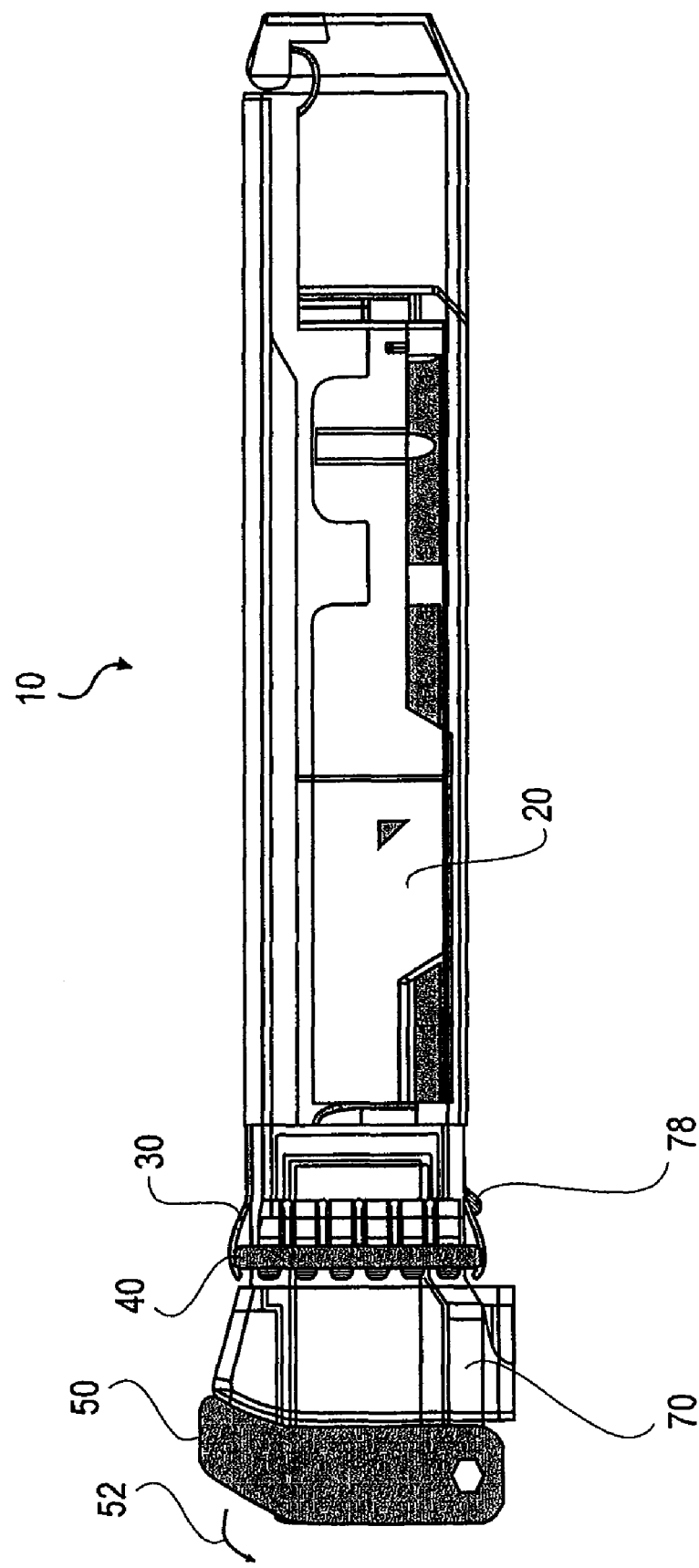
FIG. 2 is a transparent side view of the communication module of FIG. 1.

FIG. 2 is a transparent side view of the transceiver module 10 of FIG. 1 showing a latch 70 that is moved by the bail 50. As shown, the latch 70 is positioned in the bottom cavity 20 of the transceiver module 10. When the bail 50 is in the "closed" position shown in FIG. 1 and FIG. 2, a latch pin 78 engages a detent (e.g., depression, hole, cavity) in the host device to secure the transceiver module 10 within the cage. When the latch 70 is engaged this way, there is a pulling force exerted between a latch pin 78 and the detent that holds the transceiver module 10 in contact with the host device cage. When the bail 50 is moved in the direction shown by an arrow 52, the latch 70 is retracted from the detent of the host device cage so the transceiver module 10 can be easily removed from the host device.

Figure 3A:
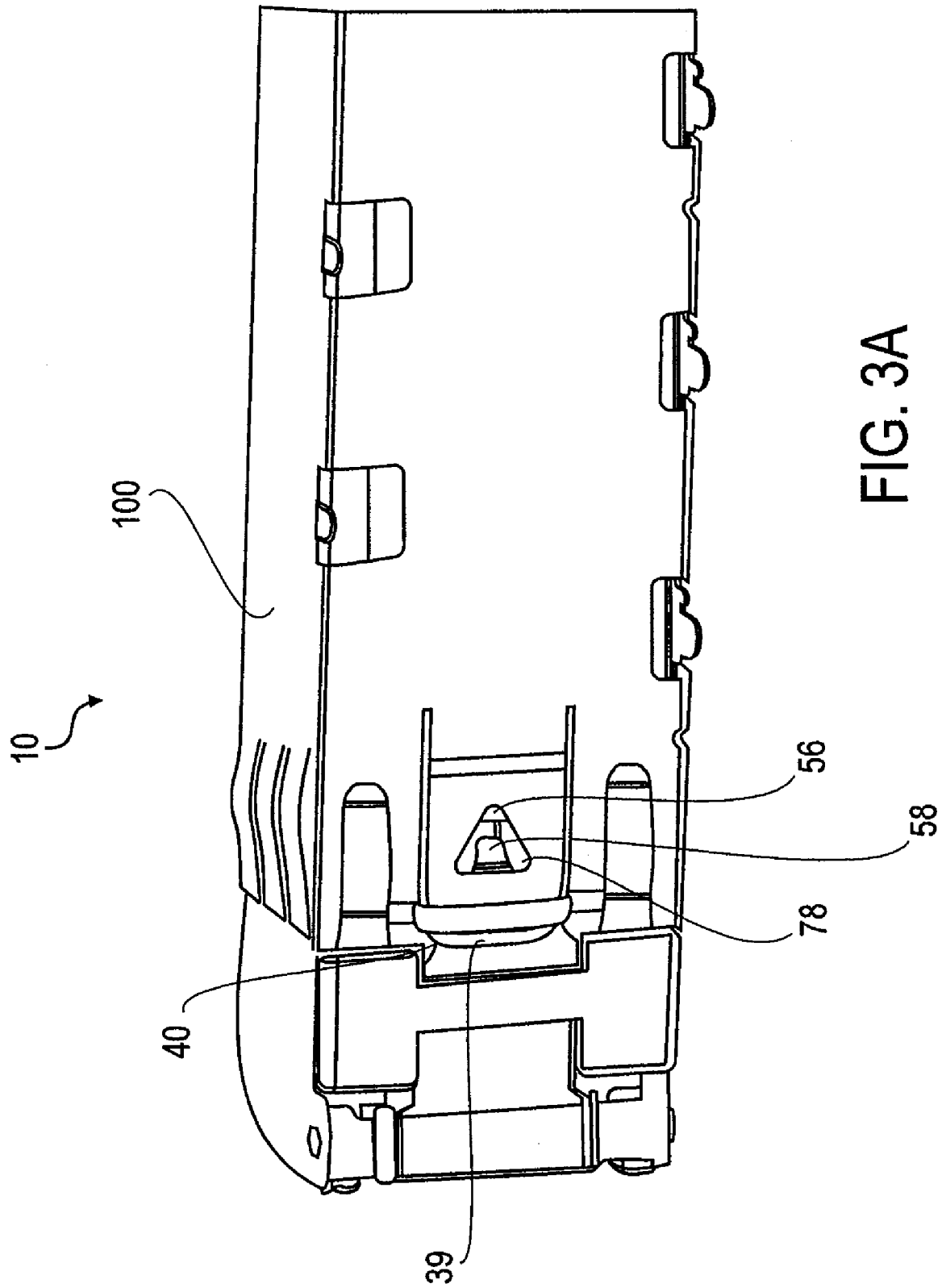
FIG. 3A is a bottom view of the communication module of FIG. 1 placed in a host device cage.

FIG. 3A is a bottom view of the transceiver module 10 placed in a host device cage 100. As shown, there is a detent 56 and a flexible tab 58 on the host device cage 100 that are designed to engage with the latch pin 78 of the latch 70. This engagement mechanism complies with the MSA standard.

Figure 3B:
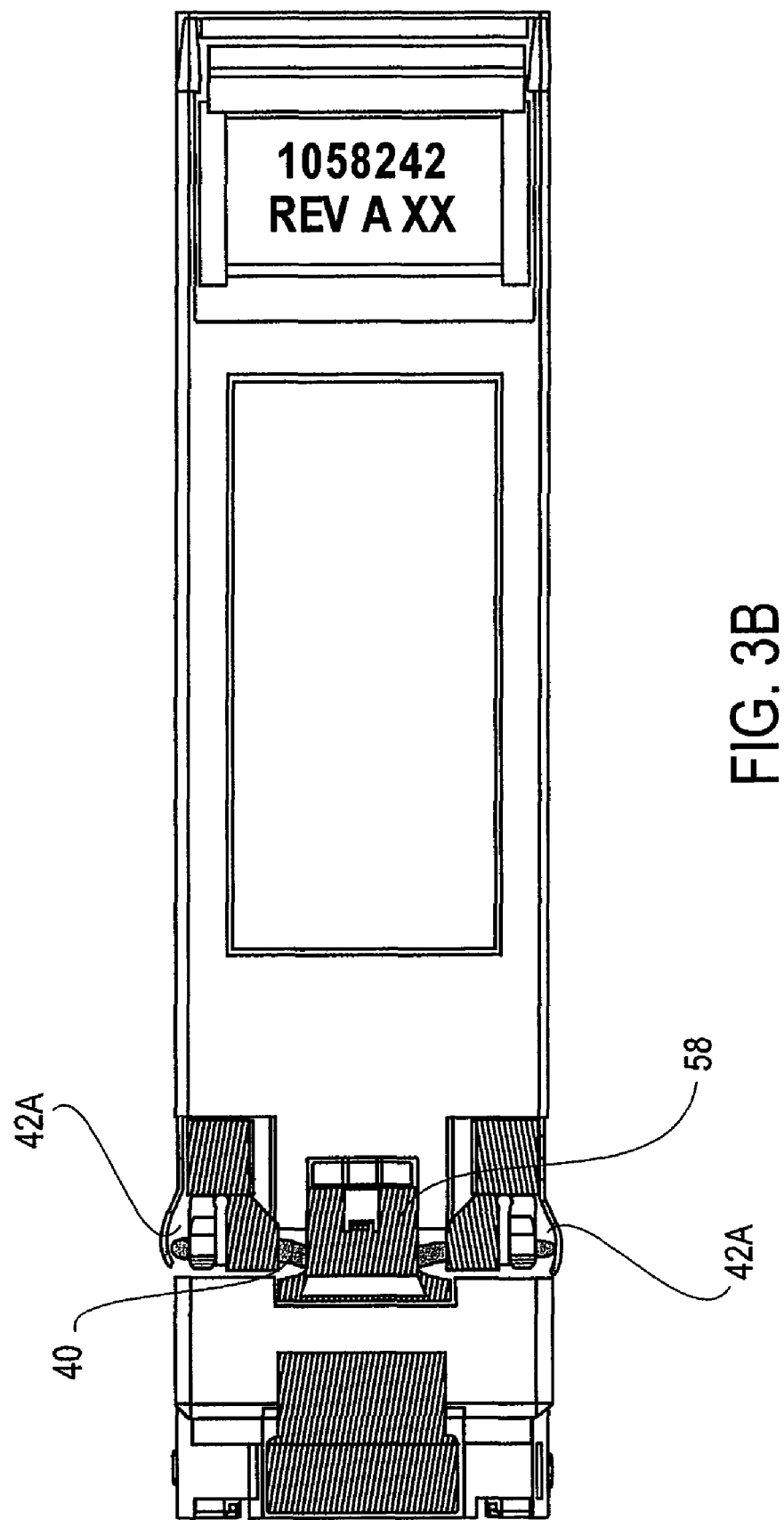
FIG. 3B is a bottom view of the communication module of FIG. 1 with the collar clip and gasket assembled.

FIG. 3B shows the bottom of the transceiver module 10. As shown, the gasket 40 extends across the flexible tab 58 of the cage 100 and at least partly fills in the widest portion of the corner cutout portions 42a. For assembly, the gasket 40 is usually slid on the transceiver module 10 and then the collar clip 30 is placed over it. The collar clip 30 is typically mounted by inserting one of the tabs 38 (see FIG. 5) into the corresponding opening in the bottom shell portion 14 and then wrapping the rest around the module to insert the other tab 38 into its corresponding opening.

Figure 4:
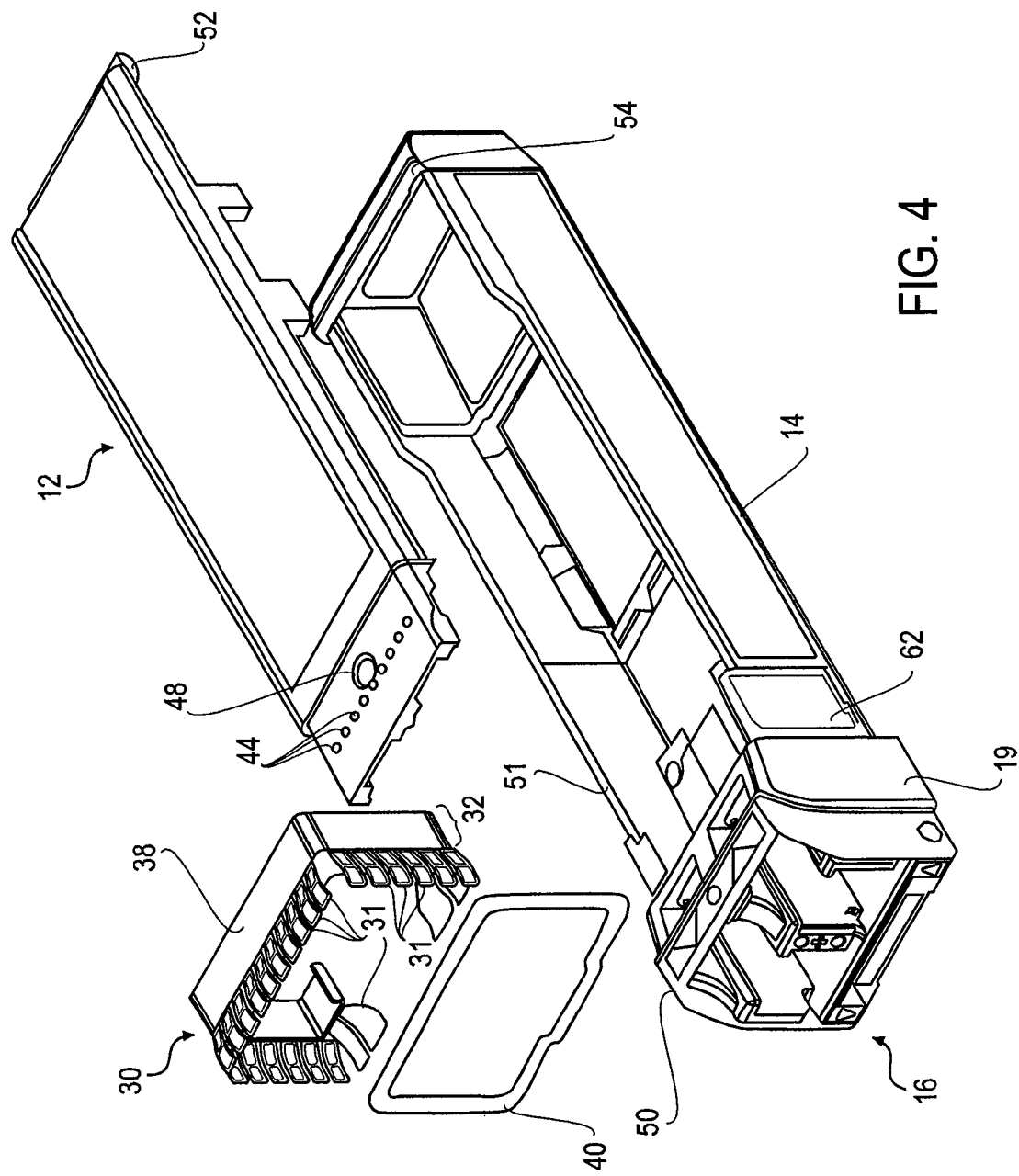
FIG. 4 is an exploded perspective view of the communication module of FIG. 1.

FIG. 4 is an exploded perspective view of the transceiver module 10. As shown, the collar clip 30 wraps around and mates the top shell portion 12 to the bottom shell portion 14. Thus, the transceiver module 10 can be opened by removing the collar clip 30 and separating the two shell portions 12, 14. Although not shown, the cavity 20 inside the transceiver module 10 usually holds a transmitter optical subassembly (TOSA), a receiver optical subassembly (ROSA), and a printed circuit board (PCB) that interface between the optical signals at the front end 16 and the electrical signals of the host device. During operation, the transceiver module 10 receives electrical signals from the host, which may be any computing system capable of communicating with the transceiver module 10, for transmission as a data-carrying optical signal on to an optical fiber. The electrical differential data signal is provided to a light source, such as a laser located in the TOSA, which converts the electrical signal into a data-carrying optical signal for transmission on to an optical fiber e.g., via an optical communication network. The laser can be an edge-emitting laser diode, a vertical cavity surface emitting laser (VCSEL), a distributed feedback (DFB) laser, or other suitable light source. The transceiver 10 also receives optical signals from an optical fiber via the ROSA. The ROSA typically includes a photodetector or other suitable device for converting the optical signals to an electrical signal that can be provided to the host device.

The collar clip 30 is positioned behind an interface portion 19 at the front end 16. The collar clip 30 has spring fingers 31 extending from a body 32. The collar clip 30 is advantageous as it eliminates the need for screws or other mechanical fasteners to hold the two shell portions 12, 14 together. At the same time, the collar clip reduces the emission of EMI from the transceiver module 10 because it is made of an electrically conductive material (e.g., a metal). In one embodiment, the collar clip 30 is made of stainless steel sheet metal.

As shown, there is a mounting recess 60 that is defined about the top and bottom shell portions 12, 14 where the body 32 of the collar clip 30 engages the surfaces of these shell portions 12, 14. Due to the presence of the mounting recess 60, the outer surface of the collar clip 30 is flush with the outer shell surfaces when the collar clip 30 is mounted. In addition, the mounting recess 60 includes a spring finger recess 62 next to the interface portion 19. The spring finger recess 62 provides a pocket between the shell portion 12, 14 and the spring fingers 31 for compression of the spring fingers 31 when the transceiver 10 is received in the cage of a host device. The compression of the spring fingers 31 is shown in more detail below, in reference to FIG. 6.

A hinge 52 is disposed at the back end of the top shell portion 12 to pivotably engage with a hinge seat 54 disposed at the back end of the bottom shell portion 14. Thus, to assemble the transceiver 10, the top shell portion 12 is pivotably coupled with the bottom shell portion 14 at the hinge/hinge seat interface such that the top shell portion seats atop the bottom shell portion. When seated, a mounting post 51 defined on the bottom shell portion 14 is received through a hole 48, assisting to secure the top shell portion 12 to the bottom shell portion 14. Once the top and bottom shell portions 12, 14 are mated, the collar clip 30 can be attached to the transceiver 10 to secure the engagement between the shell portions. To do so, the collar clip 30 is fit about the top and bottom shell portions 12, 14 to seat the body 32 in the mounting recess 60 such that the spring fingers 31 are disposed adjacent the spring finger recess 62. When the collar clip 30 is properly positioned, the tabs 38 of the collar clip bottom members 38 are received in their respective cavities on the bottom surface of the bottom shell portion 14, further securing the collar clip 30 to the transceiver.

Figure 5:
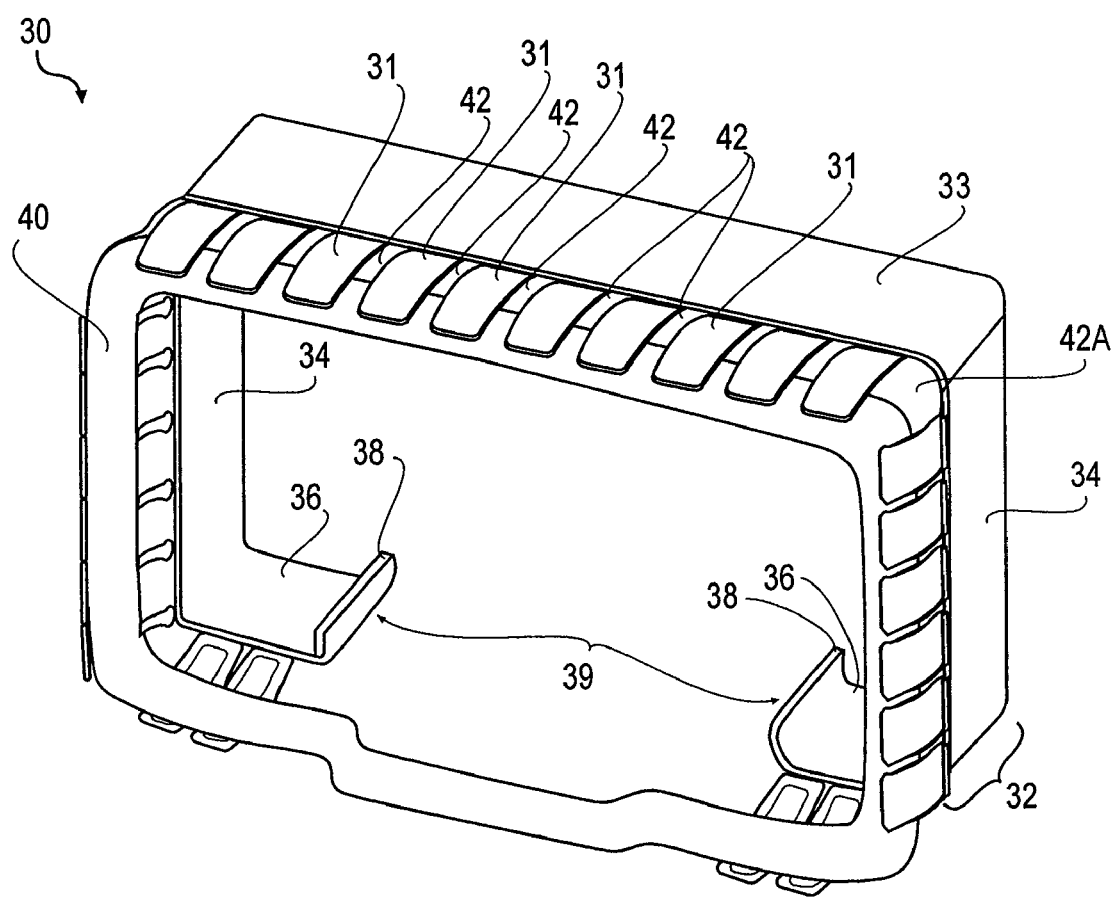
FIG. 5 is a perspective view of the collar clip and the gasket in the communication module of FIG. 1.

FIG. 5 is a perspective view of the collar clip 30 and the gasket 40, the combination of which is herein referred to as a gasketed collar. As shown, the body 32 of the collar clip 30 is composed of two vertical side members 34 that are interconnected by a top member 33. A bottom member 36 extends parallel to the top member 33 from each of the side members 34. The ends of the bottom members 36 are curved up to form tabs 38 that are separated from each other by a gap 39. The tabs 38 are positioned and sized to fit into recesses (not shown) in the bottom shell portion 14 when the collar clip 30 is assembled with the top and bottom shell portions 12, 14. The body 32 is shaped to fit around the top and bottom shell portions 12, 14 after the shell portions 12, 14 are assembled. In the particular embodiment, the body 32 forms a rectangular frame because the top and bottom shell portions 12, 14 have a rectangular cross section when assembled.

The top member 33, side members 34, and bottom members 36 each include at least one spring finger 31 that extends toward the front end 16 when the collar clip 30 is installed on the transceiver module 10. Each spring finger 31 has a curvilinear cross section. The spring fingers 31 are employed in physically contacting a cage of a host device (not shown) so as to interrupt the transmission of EMI from between the cage and the transceiver module 10.

The bottom members 36 cannot extend to close the gap 39 because if they did, they would interfere with proper operation of the detent 56 and the flexible tab 58 (see FIG. 3) of the host device cage that are used to secure the transceiver module 10 to the cage. In fact, the standard specification for certain modules, such as those having the SFP+ configuration, prohibits the covering of the flexible tab 58 of the host device cage. This prohibition essentially requires there to be a gap between the bottom members 36. A disadvantage of having the gap 39 is that there is no EMI shielding provided by the collar clip 30 in the gap 39. Thus, undesirable amount of EMI is emitted through the gap 39.

The collar clip 30 helps reduce EMI emissions from the transceiver module 10. In particular, engagement of the collar clip 30 with the transceiver 10 positions the spring fingers 31 in an extended configuration. When the transceiver module 10 is slid into the cage of a host device, the spring fingers 31 extend beyond the proximate portions of the transceiver shell surface such that the spring fingers physically contact the surface of the cage. Given that the spring fingers 31 and the collar clip 30 are composed of a conductive material, an electrical interconnection is achieved between the cage/host device and the transceiver 10, which enables the collar clip to intercept EMI emanating in the space between the transceiver shell and the host device cage. Any EMI traveling in this region during transceiver operation impinges upon the collar clip and is attenuated before escaping the cage, thereby acceptably controlling the EMI emission.

There are cutout portions 42 between adjacent spring fingers 31. Apart from enabling independent movement of the individual spring fingers, the cutout portions 42 disposed on the collar clip top member 33 are each sized to receive one of a plurality of correspondingly sized and positioned posts 44 defined on the front portion 46 of the top shell portion 12 (see FIG. 4). When the collar clip 30 is properly positioned on the transceiver 10, the posts 44 are received by the corresponding cutout portions 42, thereby assisting in maintaining the orientation and position of the collar clip on the transceiver module 10. It will be appreciated that the posts can be positioned on other portions of the mating surfaces of the top/bottom shell portions 12, 14 to engage any of the cutout portions 42 of the collar clip body 32.

While the cutout portions 42 confer the above advantages, they also cause a disadvantage from the EMI-shielding standpoint. Specifically, although the size of the cutout portions 42 are generally chosen to be small enough not to allow EMI to escape through them, the cutout portions 42a at the corners of the body 32 are enlarged due to the bending of the sheet metal. This enlargement of the corner cutout portions 42a in combination with the increasing data rate allows more than acceptable amount of EMI to escape through the corner cutout portions 42a.

The gasket 40 is useful for preventing or at least significantly reducing EMI emission through the corner cutout portions 42a and the gap 39. In one embodiment, the gasket 40 is an O-ring made of an electrically conductive, compressible material and has a cross-sectional diameter between about 0.5 mm and about 3 mm. Typically, the gasket 40 would have a circular cross section. Preferably, the gasket 40 is made of a conductive elastomer such as silicone filled with silver coated copper or aluminum particles, silicone filled with nickel coated graphite, etc. The gasket 40 closes the gap 39 and the corner cutout portions 42a where most of the EMI emission would occur, thereby significantly reducing the overall EMI emission. The particular embodiment of the gasket 40 shown in FIG. 5 goes 360-degrees around the transceiver module 10, creating a 360-degree EMI shield around the transceiver module 10.

The portion of the gasket 40 that extends across the gap 39 is not protected by the collar clip 30. However, breaking of the gasket 40 in this section is not a big concern because the tongue on the host device cage here is rounded, not sharp like other parts of the host device cage.

Figure 6:
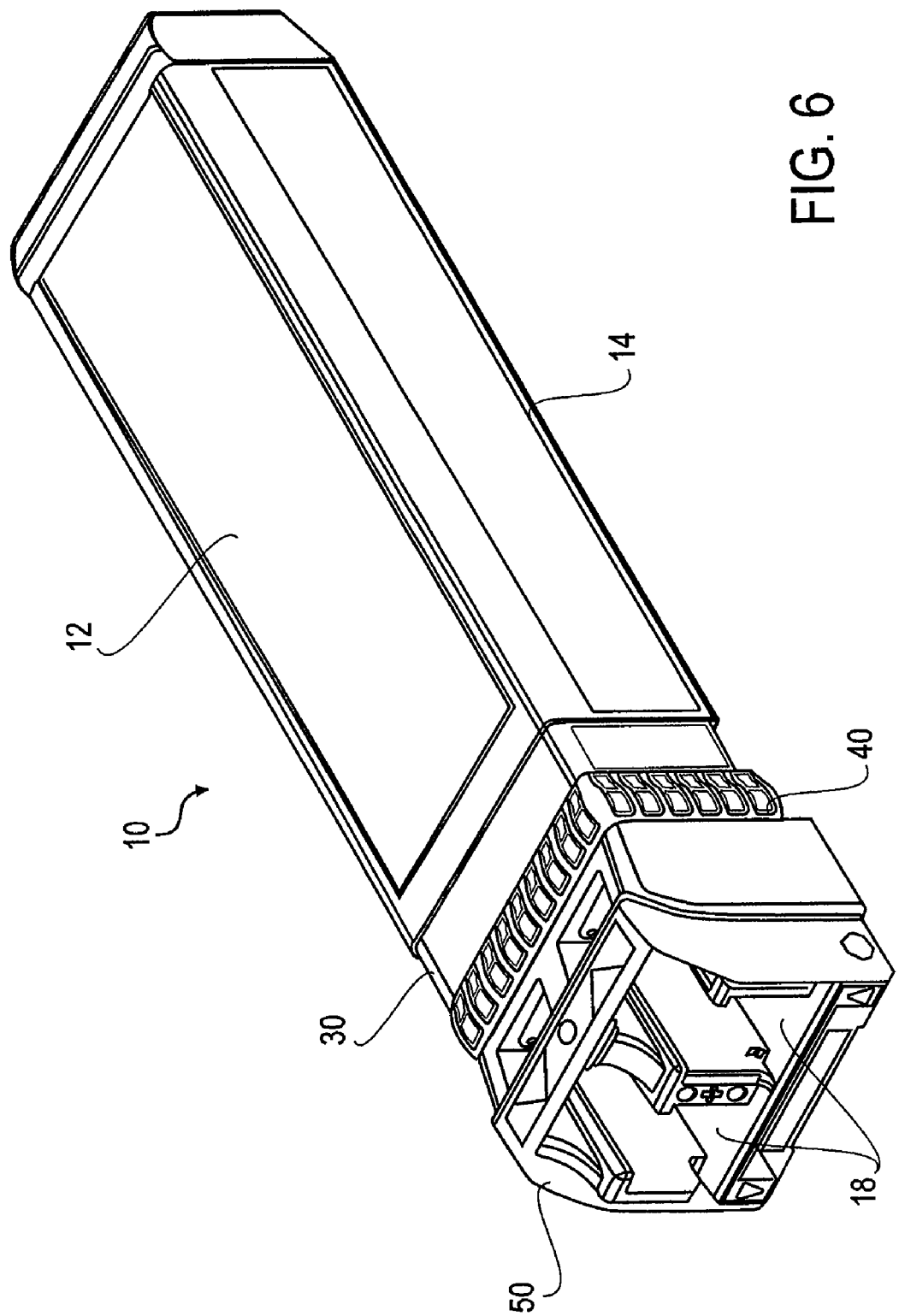
FIG. 6 is a communication module in accordance with a second embodiment of the invention.

FIG. 6 is a transceiver module 10 in accordance with a second embodiment of the invention. This embodiment is similar to the embodiment of FIG. 1, except that the gasket 40 is different. The gasket 40 of this second embodiment may have a rectangular cross section and be made of a conductive cushion material. For example, the gasket 40 may be a Cu—Ni-plated foam material sandwiched between a layer of electrically conductive Cu—Ni-plated fabric and a layer of conductive pressure-sensitive adhesive on the bottom. An example of the conductive foam that may be used for the gasket 40 has a density of about 45 kg/m$^3$ and a tensile strength of about 2 kgf/cm$^2$.

Figure 7:
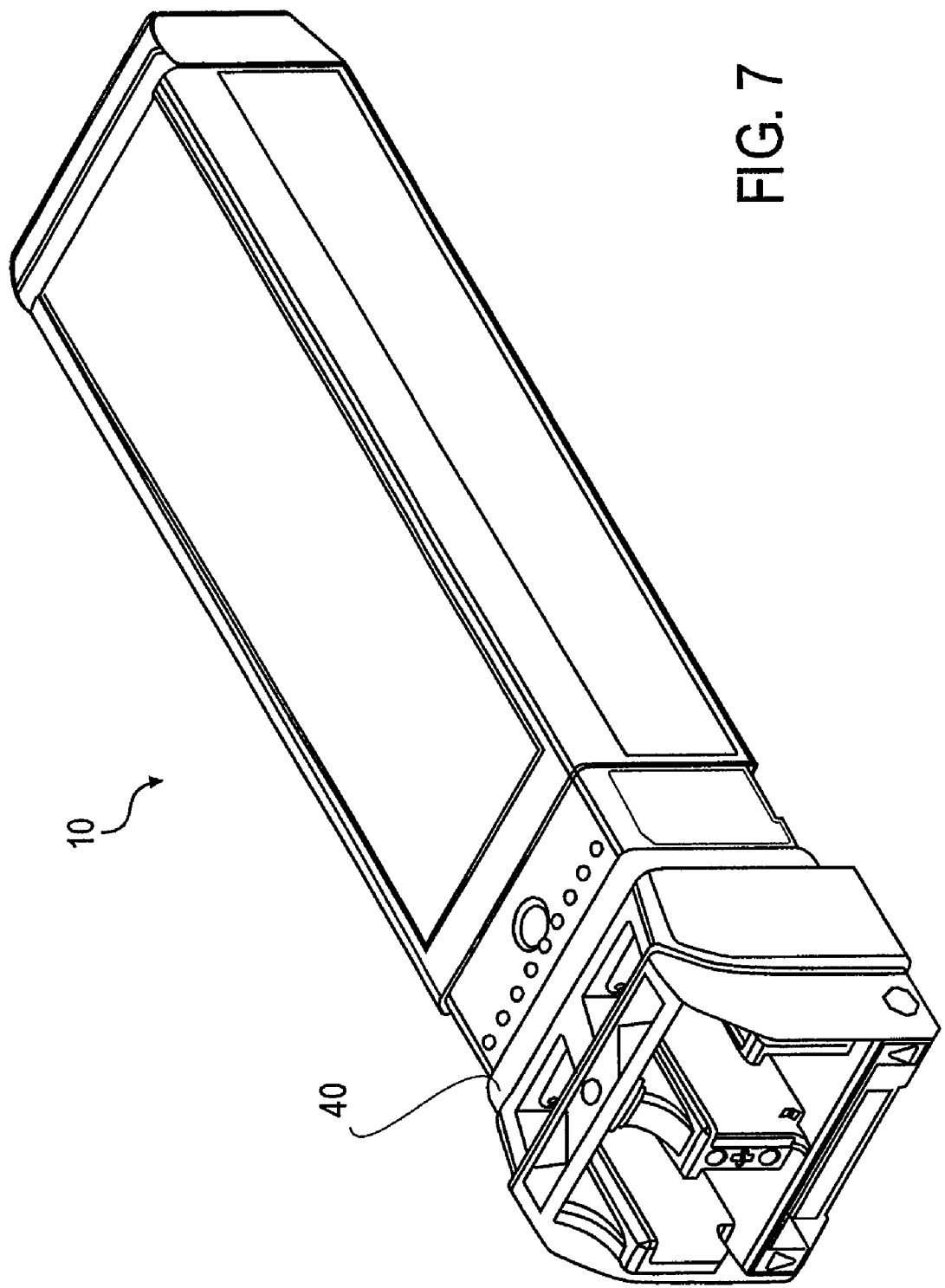
FIG. 7 is a perspective view of the communication module of FIG. 6 without the collar clip.

The conductive cushion material may be cut into 2 mm×36 mm (width and length) strips, then placed on the transceiver 10 adhesive-side down, as shown in FIG. 7. The thickness is nominally 1 mm. The Once the gasket 40 is attached to the transceiver 10, the collar clip 30 is added.

Figure 8:
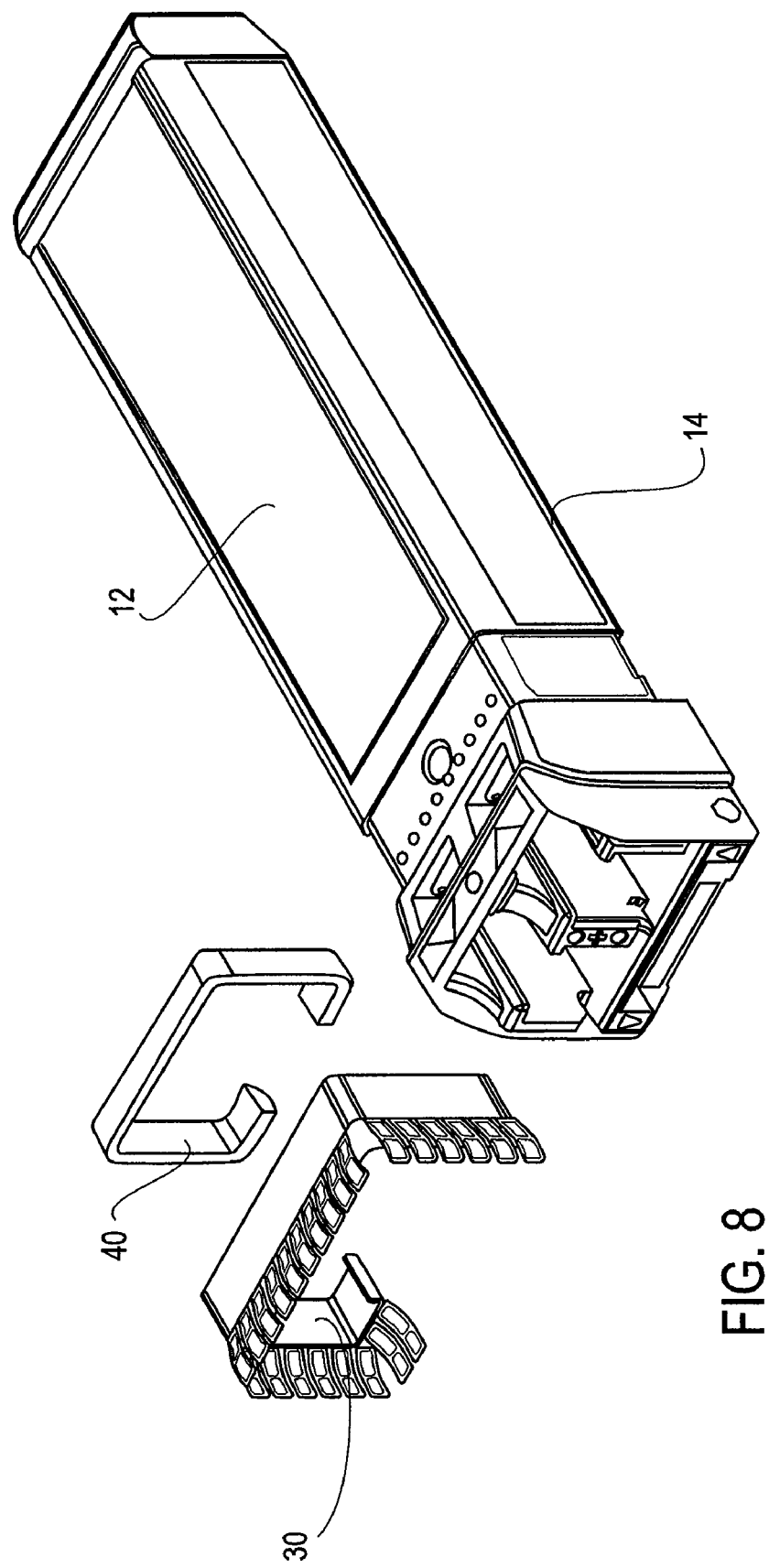
FIG. 8 is an exploded perspective view of the communication module of FIG. 6.
Figure 9:
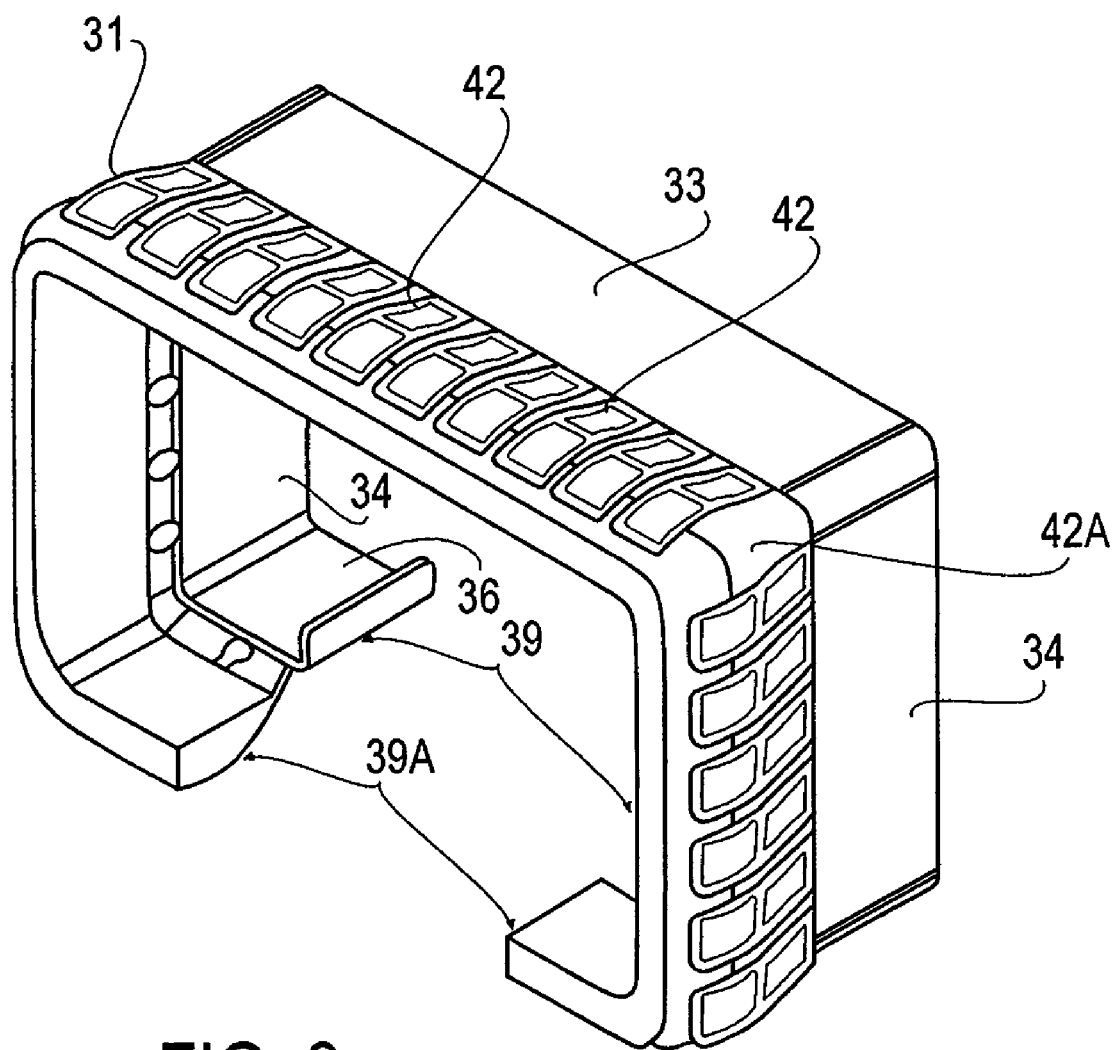
FIG. 9 is a perspective view of the collar clip and the gasket in the communication module of FIG. 6.

FIG. 8 is an exploded perspective view of the communication module of FIG. 6, and FIG. 9 is a perspective view of the gasketed collar of FIG. 6. As shown, the collar clip 30 wraps around and mates the top shell portion 12 to the bottom shell portion 14, and at the same time fixes the gasket 40 in position. This particular embodiment of gasket 40 differs from the gasket 40 in the first embodiment in a number of aspects, one of which is that it does not wrap 360° around the shell portion of the transceiver module 10. Rather, as shown in FIGS. 7 and 9, the gasket 40 has a shape that substantially mirrors the collar clip 30, having a gap 39a along one side. This embodiment is useful when having the gasket extending across the gap 39 is impractical, for example because it interferes with the latch tab or creates latching problems. This embodiment is also useful when the gasket 40 is made of a material that cannot reliably withstand the stress of rubbing against sharp edges (e.g., sharp edges of the host cage) without protection from the collar clip 30.

If desired, the gasket 40 may be used alone, without the collar clip 30. However, if the gasket 40 is used without the collar clip 30, it will wear out quickly because it is made of a compressible and often elastomeric material. The sheet metal at the opening of the host device cage has sharp edges that would wear out the gasket 40 after multiple insertions into the cage. The collar clip 30 protects the gasket 40 by preventing it from directly rubbing against sharp edges. The spring fingers 31a adjacent to the gap 39 are wider than other spring fingers 34 to prevent the gasket from touching the sharp edges of the cage. The spring fingers 31a extend beyond the sharp edges of the cage, which would be positioned around the broken lines 57. The gasket used in combination with a metal collar provides durability to the gasket and extends its lifespan and the number of insertions that it can undergo. Although the sheet metal collar is given as an example of a collar that can be used in combination with the conductive gasket other forms of collars can be used in this configuration such as wire mesh collars, conductive plastic collars, etc.

Also, the collar clip 30 constrains the gasket 40 so that the gasket 40 does not slide out of position. The collar orients and maintains the gasket in the correct functional position during insertion and extraction of the transceiver module.

Figure 10:
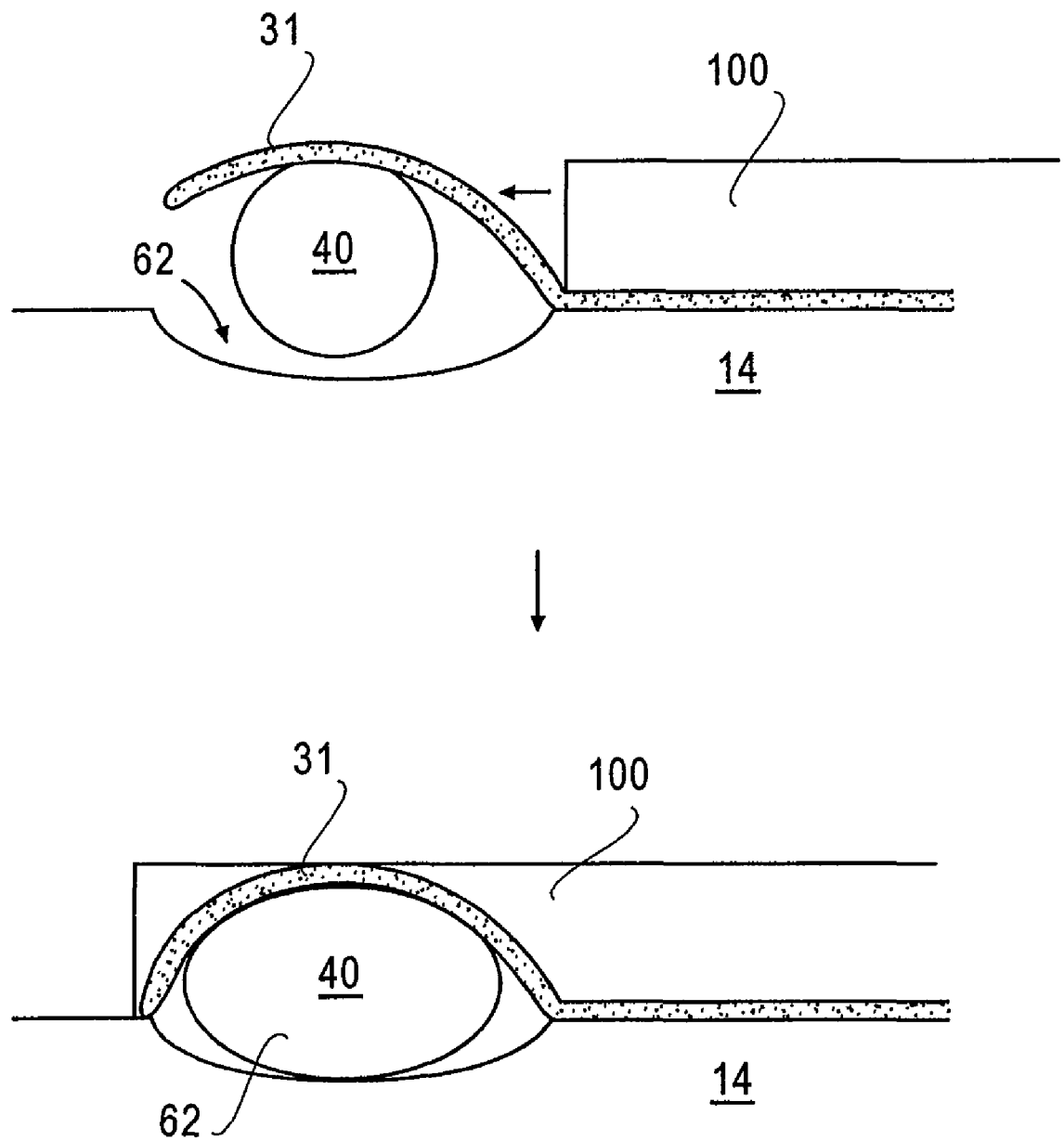
FIG. 10 is a cross-sectional view of the collar clip assembled with the gasket and the shell portions of the communication module.

FIG. 10 is a cross-sectional view of the collar clip 30 assembled with the gasket 40 and the shell portions 12, 14, and illustrates how the gasket 40 is compressed between the spring fingers 31 and the recess 62 formed in the bottom shell portion 14. As shown, the spring fingers 31 become compressed to move closer to the recess 62 when the transceiver module 10 is placed in the host device cage 100. The gasket 40 is sized so that when it is compressed, it fits in the "pocket" created by the curve of the recess 62 and the curve of the spring fingers 31.

Figure 11A:
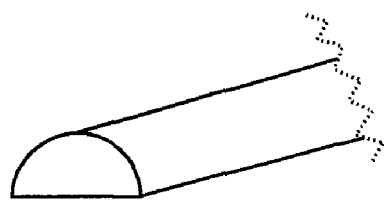
FIGS. 11A, 11B, and 11C show alternative embodiments of the gasket.
Figure 11B:
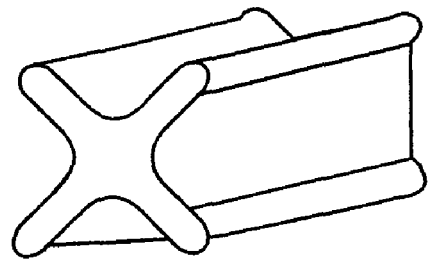
Figure 11C:
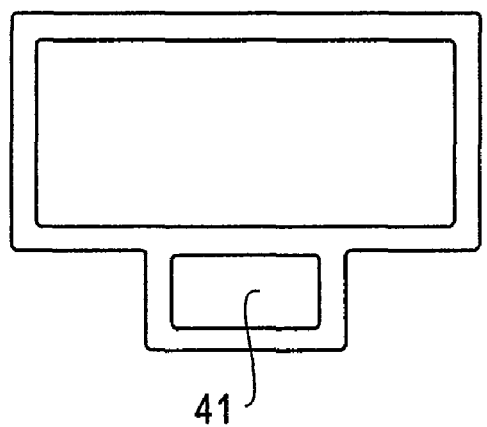

FIGS. 11A, 11B, and 11C show alternative embodiments of the gasket 40. FIG. 11A is a cross section of the gasket 40 where the gasket 40 is a D-ring made of a conductive elastomer. With a D-ring is used instead of an O-ring, the shape of the recess 62 may be changed so that there is a flat portion of which the flat portion of the E-ring can est. FIG. 11B is a cross section of the gasket 40 where the gasket 40 is a ring having a star-shaped cross section. Using this type of star-ring would increase the compressibility of the gasket 40. In FIG. 11C, the gasket 40 is an injection-molded frame that matches the shape of the transceiver module 10 rather than an O-ring. The segment of the injection-molded frame that would extend across the gap 39 may be made thicker than the rest of the frame and optionally have an opening 41 for extra compressibility.

Although the gasket 40 in the particular embodiment is made of an electrically conductive elastomer, this is not a limitation of the invention and any material that is conductive and compressible may be used. For example, the gasket 40 may be made of foam covered with a conductive fabric or a wire mesh.

Likewise, the gasket 40 wrapping 360-degrees around the transceiver module 10 is not a limitation of the invention. For example, the gasket 40 may be short segments of a conductive elastomer positioned around the corner cutout portions 42a and the gap 39. The short segments may be dispensed material attached to adjacent spring fingers 31. Alternatively, the gasket material may be injection molded in selective spots where EMI leakage is high.

Various modifications may be made to the gasket 40 depending on the design and application. For example, in an XFP module, the host device cage has the spring fingers 31. In a case like this, the curve of the spring fingers 31 would be reversed so there is a pocket formed between the spring fingers 31 and the inner walls of the host device cage. The gasket 40 would be positioned in this pocket.

While the invention has been described in terms of particular embodiments and illustrative figures, those of ordinary skill in the art will recognize that the invention is not limited to the embodiments or figures described. Therefore, it should be understood that the invention can be practiced with modification and alteration within the spirit and scope of the appended claims. The description is not intended to be exhaustive or to limit the invention to the precise form disclosed. It should be understood that the invention can be practiced with modification and alteration and that the invention be limited only by the claims and the equivalents thereof.

What is claimed is:

1. A gasketed collar for reducing EMI emission from a communication module, the gasketed collar comprising:
   a conductive and compressive gasket;
   a conductive metal collar, holding the gasket and having two ends, that fits at least partway around the communication module with a first gap between the ends; and
   the gasket fitting at least partway around the communication module and overlapping the inner surface of the conductive metal collar.

2. The gasketed collar of claim 1, wherein the gasket is positioned between a surface of the communication module and the conductive metal collar.

3. The gasketed collar of claim 1, wherein the conductive metal collar comprises a body and spring fingers attached to the body, further comprising a cutout portion between neighboring spring fingers.

4. The gasketed collar of claim 3, wherein the spring fingers are designed to press down on the gasket upon receiving pressure.

5. The gasketed collar of claim 3, wherein the gasket extends across the cutout portion between the neighboring spring fingers.

6. The gasketed collar of claim 3, wherein the body of the conductive metal collar is a rectangularly shaped frame and wherein the cutout portion at a corner of the rectangularly shaped frame is larger than the cutout portion along a side of the rectangularly-shaped frame.

7. The gasketed collar of claim 3, wherein the cutout portion at the corner of the rectangularly shaped frame is at least partly closed by the gasket.

8. The gasketed collar of claim 1, wherein the gasket is a loop that fits completely around a portion of the communication module and extends across the first gap in the conductive metal collar.

9. A gasketed collar for reducing EMI emission from a communication module, the gasketed collar comprising:
a conductive and compressive gasket;
a conductive metal collar, holding the gasket and having two ends, that fits at least partway around the communication module with a first gap between the ends; and
the gasket fitting at least partway around the communication module and overlapping the conductive metal collar;
wherein the conductive metal collar comprises a body and spring fingers attached to the body, further comprising a cutout portion between neighboring spring fingers, and wherein the gasket overlaps the spring fingers but not the body of the conductive metal collar.

10. A gasketed collar for reducing EMI emission from a communication module, the gasketed collar comprising:
a conductive metal collar having two ends that fits at least partway around the communication module with a gap between the ends; and
a gasket that is electrically conductive and compressible, wherein the gasket fits partway around the communication module and overlaps the conductive metal collar, and wherein the gasket has a second gap that is approximately the same distance as the first gap in the metal collar and positioned to coincide with the first gap of the metal collar.

11. The gasketed collar of claim 1, wherein the gasket comprises a conductive cushion material.

12. The gasketed collar of claim 1, wherein the gasket comprises a Cu—Ni-plated foam material.

13. The gasketed collar of claim 1, wherein the gasket comprises an electrically conductive, compressible material.

14. The gasketed collar of claim 1, wherein the gasket comprises silicone filled with silver-coated copper or aluminum particles.

15. The gasketed collar of claim 1, wherein the gasket comprises silicone filled with nickel-coated graphite.

16. The gasketed collar of claim 1, wherein the communication module is an optical transceiver module.

17. A method of reducing EMI emission from a communication module, the method comprising placing a conductive gasket to overlap the inner surface of a conductive metal collar that has two ends and that fits at least partway around the communication module with a gap between the ends, wherein the gasket closes an opening in the conductive metal collar.

18. The method of claim 17, wherein placing the gasket comprises placing the gasket between the conductive metal collar and the communication module.

19. The method of claim 17, wherein placing the gasket comprises:
attaching the gasket to the communication module; and
fitting the conductive metal collar over the gasket.

20. A method of reducing EMI emission from a communication module, the method comprising:
placing a gasket to overlap a conductive metal collar that fits at least partway around the communication module, wherein the conductive metal collar has a first gap between its two ends; and
further comprising placing the gasket such that the gasket has a second gap that is approximately the same distance as the first gap and coincides with the first gap.

21. A communication module comprising:
a module body;
a conductive metal collar that has two ends and that fits at least partway around the communication module body with a gap between the two ends; and
a gasket that is electrically conductive and compressible, the gasket being designed to fit at least partway around the module body and overlap the inner surface of the conductive metal collar.

22. The communication module of claim 21, wherein the gasket is positioned between a surface of the module body and the conductive metal collar.

23. The communication module of claim 21, wherein the conductive metal collar comprises a frame and spring fingers attached to the frame, further comprising a cutout portion between neighboring spring fingers.

24. The communication module of claim 23, wherein the spring fingers are designed to press down on the gasket upon receiving pressure.

25. The communication module of claim 23, wherein the gasket extends across the cutout portion between the neighboring spring fingers.

26. The communication module of claim 21, wherein the gasket comprises a conductive cushion material.

27. The communication module of claim 21, wherein the gasket comprises a Cu—Ni-plated foam material.

28. The communication module of claim 21, wherein the gasket comprises an electrically conductive, compressible material.

29. The communication module of claim 21, wherein the gasket comprises silicone filled with silver-coated copper or aluminum particles.

30. The communication module of claim 21, wherein the gasket comprises silicone filled with nickel-coated graphite.

31. The communication module of claim 21, wherein the communication module is an optical transceiver module.

* * * * *